US007440355B2

(12) United States Patent
Sato et al.

(10) Patent No.: US 7,440,355 B2
(45) Date of Patent: Oct. 21, 2008

(54) SEMICONDUCTOR MEMORY DEVICE

(75) Inventors: Hajime Sato, Tokyo (JP); Masao Shinozaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 311 days.

(21) Appl. No.: 11/452,232

(22) Filed: Jun. 14, 2006

(65) Prior Publication Data

US 2007/0019457 A1    Jan. 25, 2007

(30) Foreign Application Priority Data

Jul. 21, 2005  (JP) ............. 2005-211182

(51) Int. Cl.
*G11C 7/00* (2006.01)
(52) U.S. Cl. ................. 365/230.03; 365/208
(58) Field of Classification Search ........... 365/233, 365/226–229

See application file for complete search history.

(56) References Cited

U.S. PATENT DOCUMENTS 6,381,167 B2 * 4/2002 Ooishi et al. ............... 365/63

6,795,332 B2 * 9/2004 Yamaoka et al. ............ 365/154

FOREIGN PATENT DOCUMENTS

JP    2001-344965    6/2000
JP    2002-368135    6/2001

* cited by examiner

*Primary Examiner*—Huan Hoang
*Assistant Examiner*—Michael J Weinberg
(74) *Attorney, Agent, or Firm*—Reed Smith LLP; Stanley P. Fisher, Esq.; Juan Carlos A. Marquez, Esq.

(57) ABSTRACT

The present invention provides a semiconductor memory device in which the number of write amplifiers is decreased by increasing the number of bit line pairs connected to one pair of common write data lines. Further, by decreasing the number of bit line pairs connected to one pair of common read data lines, parasitic capacitance connected to the pair of common read data lines is reduced and, accordingly, time in which the potential difference between the pair of common read data lines increases is shortened. Thus, while preventing enlargement of the chip layout area, read time can be shortened.

10 Claims, 12 Drawing Sheets

SEMICONDUCTOR MEMORY DEVICE

CROSS-REFERENCE TO RELATED APPLICATION

The present application claims priority from Japanese patent application No. 2005-211182 filed on Jul. 21, 2005, the content of which is hereby incorporated by reference into this application.

BACKGROUND OF THE INVENTION

The present invention relates to a semiconductor memory device and, more particularly, to a technique for improving layout of the semiconductor memory device. The invention relates to, for example, a technique which is effectively applied to a static memory in which static memory cells are connected to a plurality of word lines and a plurality of bit lines disposed so as to cross the word lines.

Examples of the semiconductor memory device include a dynamic random access memory (abbreviated as "DRAM") using dynamic memory cells as memory cells as disclosed in Japanese Unexamined Patent Publication No. 2001-344965 (Patent Document 1) and a static random access memory (abbreviated as "SRAM") using static memory cells as memory cells as disclosed in Japanese Unexamined Patent Publication No. 2002-368135 (Patent Document 2).

Patent Document 1 describes a technique for reducing parasitic capacitance in data lines in a DRAM. According to the technique, as shown in FIG. 4 of Patent Document 1, a read data line pair is disposed every column of four memory cells, and column selection in data reading operation is performed by four sub read source lines. A write data line pair is disposed every eight memory cells, and column selection in data line writing operation is performed by eight sub write activate lines. By making the number of read data line pairs, the number of write data line pairs, and the number of memory cell columns associated with the read data line pairs and the write data line pairs different from each other, while avoiding conspicuous increase in signal wirings for selecting a column, the wiring pitch of data lines is lessened, and parasitic capacitance is suppressed.

SUMMARY OF THE INVENTION

In a DRAM, one sense amplifier is provided for a pair of bit lines. However, when one sense amplifier is disposed for a pair of bit lines in an SRAM, the layout area increases. Consequently, it is usually constructed so that a pair of common read data lines and a pair of common write data lines are connected to a plurality of bit lines, the number of sense amplifiers and the number of write amplifiers are the same, and the number of common read data line pairs and the number of common write data line pairs are the same. In such a configuration, to increase the speed of reading operation on a memory cell in which read current is small, it is considered to decrease the number of bit line pairs associated with a pair of common read data lines. However, decrease in the number of bit line pairs associated with a pair of common data lines in an SRAM means increase in the number of sense amplifiers and write amplifiers, and it causes enlargement of the layout area of a memory mat.

An object of the present invention is to provide a technique for increasing the reading speed while suppressing enlargement of the layout area of a memory mat.

The above and other objects and novel features of the present invention will become apparent from the description of the specification and appended drawings.

An outline of typical one of inventions disclosed in the application will be briefly described as follows.

The present invention provides a semiconductor memory device including: a plurality of word lines; a plurality of bit lines provided so as to cross the word lines; a plurality of memory cells coupled to the word lines and the bit lines; a write amplifier for writing data to the memory cells; and a sense amplifier for amplifying a signal output from the memory cells, the write amplifier and the sense amplifier being shared by the bit lines, wherein a first common data line for connecting the bit lines to the write amplifier, and a second common data line for connecting the bit lines to the sense amplifier are provided, and the number of bit lines corresponding to the second common data line is smaller than the number of bit lines corresponding to the first common data lines.

By setting the number of bit lines corresponding to the second common data line to be smaller than the number of bit lines corresponding to the first common data line, while minimizing increase in the number of write amplifiers, parasitic capacitance connected to the first common data line can be reduced. Thus, time in which the potential difference between the pair of common read data lines can be shortened, so that increase in the speed of reading can be achieved while suppressing enlargement of the layout area of a memory mat.

An effect obtained by the typical one of the inventions disclosed in the application is briefly described as follows.

In short, increase in the speed of reading can be achieved while suppressing enlargement of the layout area of a memory mat.

DETAILED DESCRIPTION OF THE PREFERRED EMBODIMENTS

Figure 1:
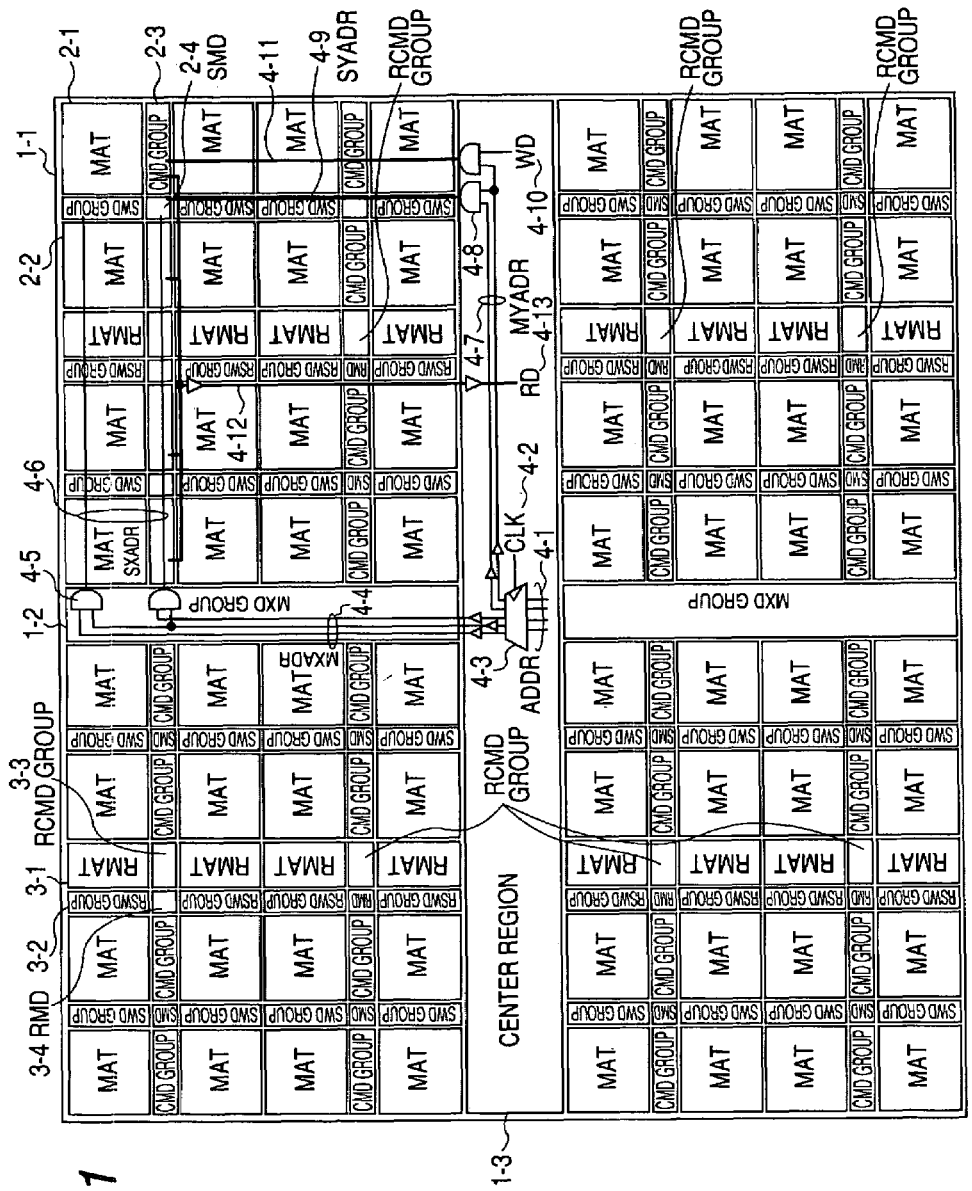
FIG. 1 is a diagram showing a general configuration of an SRAM as an example of a semiconductor memory device according to the present invention.
Figure 2:
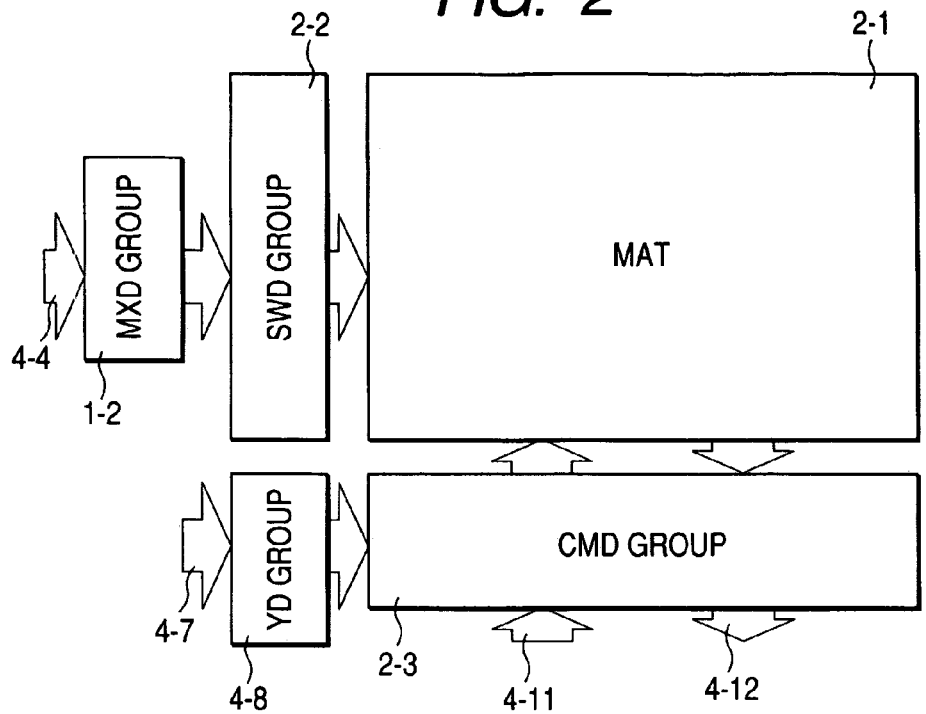
FIG. 2 is a block diagram showing a configuration example of a main part in the SRAM.

FIG. 1 shows an SRAM as an example of a semiconductor memory device according to the present invention. FIG. 2 schematically shows the relation between one of a plurality of memory mats in the SRAM illustrated in FIG. 1 and peripheral circuits of the memory mat.

An SRAM 1-1 shown in FIG. 1 is, although not limited, formed on a semiconductor substrate such as a single crystal silicon substrate by a known semiconductor integrated circuit manufacturing technique.

The SRAM 1-1 is divided into four areas by a center region 1-3 and a main X decode circuit group (MXD group) 1-2 formed so as to cross the center region 1-3. In each of the four areas, a plurality of normal memory mats (MAT) 2-1, a plurality of normal sub word driver groups (SWD groups) 2-2, a plurality of normal column selection circuit groups (CMD groups) 2-3, a plurality of sub mat decode circuits (SMD) 2-4, a plurality of redundancy memory mats (RMAT) 3-1, a plurality of redundancy sub word driver groups (RSWD groups) 3-2, a plurality of redundancy column selection circuit groups (RCMD groups) 3-3, and a plurality of redundancy sub mat decode circuits (RMD) 3-4 are formed.

The normal memory mat 2-1 is obtained by arranging a plurality of memory cells (hereinbelow, called "cells") each for storing one bit of binary information in a matrix. The normal sub word driver group 2-2 has the function of driving a sub-word line (indicated as 5-5 in FIG. 4) connected to a desired sub word driver in the normal memory mat 2-1. The normal column selection circuit group 2-3 includes a column selection circuit for selecting a desired bit line pair (indicated as 6-3 and 6-4 in FIG. 4) in the memory mat 2-1, a write amplifier (WA) for writing data, and a sense amplifier (SA) for amplifying a read signal. The normal sub mat decode circuit 2-4 has the function of selecting one of the normal sub word driver groups 2-2 and one of the normal column selection circuit groups 2-3.

The center region 1-3 includes an address multiplexer 4-3 for distributing input address signals, a plurality of main Y decode circuits 4-8 for decoding an input Y address signal, and a plurality of control circuits and input/output circuits as other circuits.

The main X decode circuit group 1-2 includes a plurality of main X decode circuits 4-5 for decoding a plurality of main X address signals 4-4.

To the sub word circuit group 2-2 and the sub mat decode circuit 2-4, a plurality of sub X address signals (SXADR) 4-6 obtained by decoding the plurality of main X address signals (MXADR) 4-4 in the main X decode circuit 4-5 are input. A plurality of main Y address signals (MYADR) 4-7 are decoded by the plurality of Y decode circuits 4-8 and are input to the sub mat decode circuit 2-4 via a sub Y address signal (SYADR) 4-9. On the basis of a decoded output of the sub mat decode circuit 2-4, a desired normal sub word driver group 2-2 and a desired normal column selection circuit group 2-3 are selected. On the basis of a decoded output of the normal sub word driver group 2-2, a desired sub word line in the normal memory mat 2-1 is driven to a selection level, so that data can be written/read to/from a cell coupled to the sub word line.

The main X address signals 4-4 and the main Y address signals 4-7 are distributed via the address multiplexer 4-3 from the signals (ADDR) 4-1 obtained by buffering an external address or an external address signal once or more. In the SRAM 1-1 synchronized with an external clock signal, an address signal 4-1 is distributed synchronously with a clock signal (CLK) 4-2.

In data writing operation, write data (WD) 4-10 is external input data or a signal obtained by buffering external input data once or more, logic between the write data 4-10 and the Y address signal is calculated, and the resultant is input to the normal column selection circuit group 2-3 via a write data bus 4-11. In the normal column selection circuit group 2-3, a desired bit line pair in the memory mat 2-1 is selected and the write data is transmitted to the bit line pair via a not-shown write amplifier, thereby enabling the data to be written.

On the other hand, in data reading operation, a signal read from a cell is amplified by a not-shown sense amplifier in the normal column selection circuit group 2-3 and, after that, the amplified signal is output as external output data (RD) 4-13 via a read data bus 4-12.

The redundancy memory mat 3-1, the redundancy sub word driver group 3-2, the redundancy column selection circuit group 3-3, and the redundancy sub mat decode circuit 3-4 are disposed in correspondence with the normal memory mat 2-1, the normal sub word driver group 2-2, the normal column selection circuit group 2-3, and the normal sub mat decode circuit 2-4, respectively, thereby enabling redundancy repair to be performed on the normal circuits.

Figure 3:
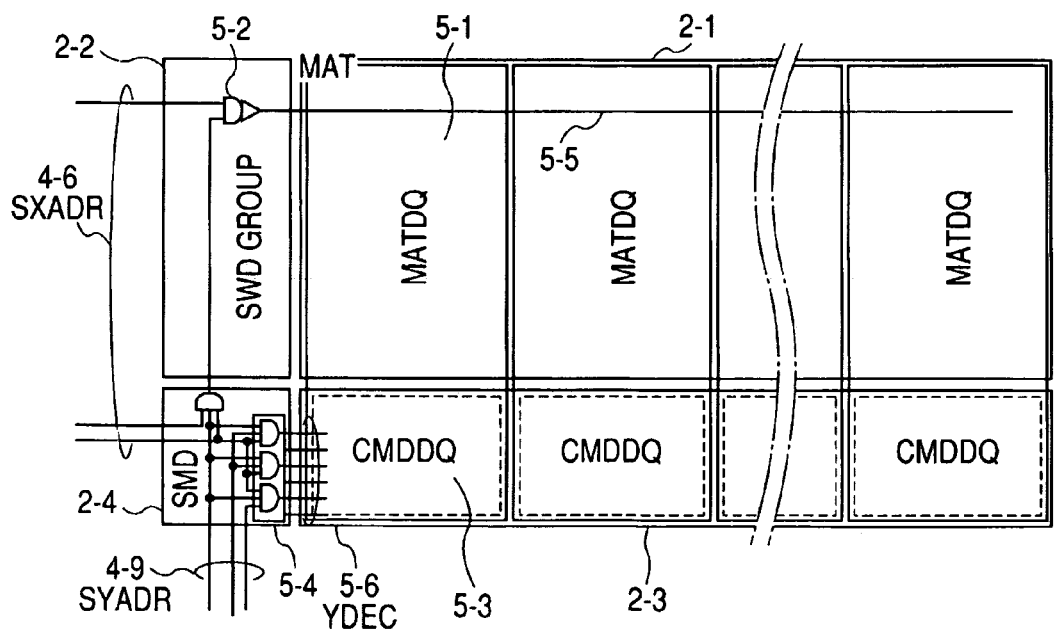
FIG. 3 is a circuit diagram showing a configuration example of a normal memory mat in the SRAM and its peripheral part.

FIG. 3 shows a configuration example of the normal memory mat 2-1 and its peripheral part.

The normal memory mat 2-1 is divided into a plurality of normal sub memory mats (MATDQ) 5-1. The normal column selection circuit group 2-3 includes a plurality of normal column selection circuit blocks (CMDDQ) 5-3 disposed in correspondence with division of the normal memory mat 2-1. The normal sub word driver group 2-2 includes a plurality of normal sub word drivers 5-2, and a sub word line 5-5 is driven by the normal sub word driver 5-2. The sub mat decode circuit 2-4 includes a plurality of logic circuits for decoding the plurality of sub X address signals 4-6 and the plurality of sub Y address signals 4-9, and decoded outputs are divided into the normal column selection circuit group 2-3 and the normal sub word driver group 2-2. By a logic circuit 5-4 for decoding the sub Y address signal 4-9, a column decode signal (YDEC) 5-6 is generated.

Figure 4:
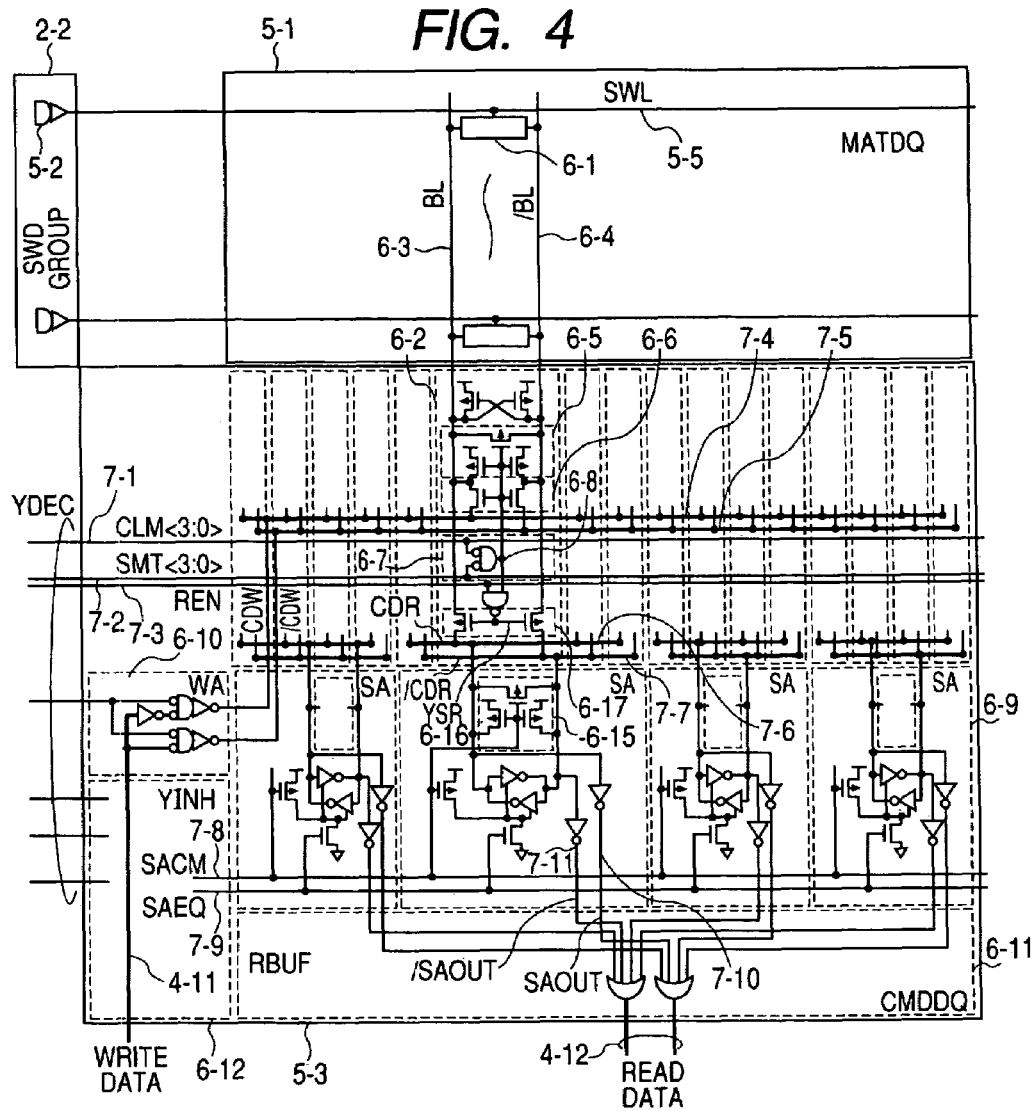
FIG. 4 is a circuit diagram showing a detailed configuration example of a main part in FIG. 3.
Figure 5:
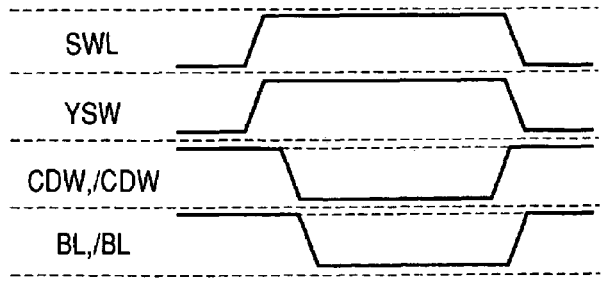
FIG. 5 is a timing chart showing writing operation of a main part in the configuration illustrated in FIG. 4.
Figure 6:
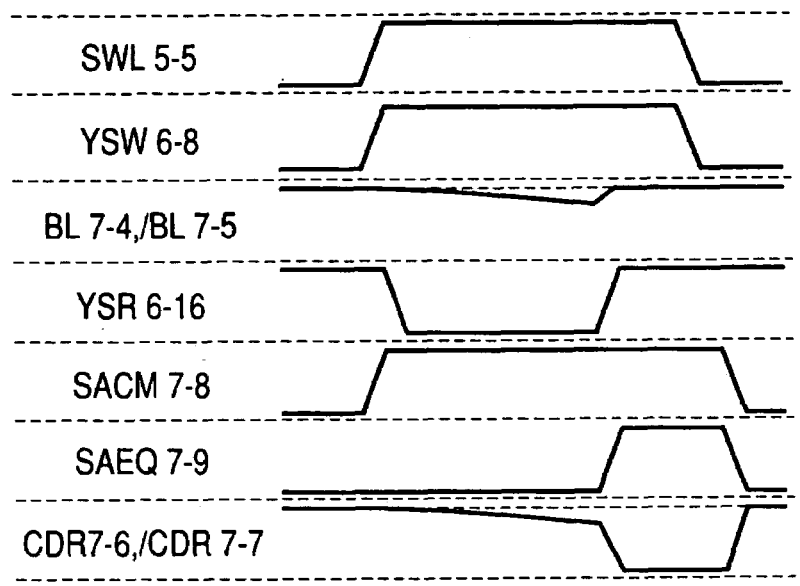
FIG. 6 is a timing chart showing reading operation of the main part in the configuration illustrated in FIG. 4.

FIG. 4 shows a detailed configuration example of the peripheral components of the cell. FIG. 5 shows write operation timings of the main components in the configuration of FIG. 4. FIG. 6 shows read operation timings of the main components in the configuration of FIG. 4.

The normal sub memory mat 5-1 is constructed in such a manner that the plurality of sub word lines (SWL) 5-5 and a plurality of bit line pairs (BL and /BL) 6-3 and 6-4 cross each other and cells 6-1 are disposed at the intersections.

The column selection circuit block 5-3 includes a plurality of column selection circuits 6-2, a plurality of sense amplifiers 6-9, a write amplifier (WA) 6-10, a read data buffer (RBUF) 6-11, and a control circuit (YINH) 6-12 capable of controlling the operations of the circuits.

The sub word line (SWL) 5-5 is a line driven by the sub word driver 5-2 to select a cell to be connected to a desired sub word line among the plurality of cells 6-1 in the normal sub memory mat 5-1. The column selection circuit 6-2 selectively couples the bit line pair (BL and /BL) 6-3 and 6-4 to a common read data line pair (CDR and /CDR) 7-6 and 7-7. The bit line pairs 6-3 and 6-4 are provided in correspondence with the number of cell columns in the memory mat 2-1 and only a desired bit line pair is selected by the column selection circuit 6-2. The column selection circuit 6-2 includes a precharge circuit 6-5 for precharging the pair of bit lines 6-3 and 6-4, a data write gate 6-6 for data to be written, a column selection decoder 6-7 for selecting a column in the data reading operation, and a data read gate 6-17 enabling data to be read. To the column selection decoder 6-7, to select a bit line pair, one of a plurality of column selection signals (CLM<3:0>) 7-1 and one of a plurality of column selection signals (SMT<3:0>) 7-2 are connected to select a bit line pair. The operation of the data read gate 6-17 is controlled by a column switch control signal (YSR) 6-16. The column switch control signal 6-16 is generated by obtaining NAND logic between a decode output 6-8 of the column selection decoder 6-7 and a read control signal (REN) 7-3.

In the data writing operation, the potential of one of common write data lines (CDW and /CDM) 7-4 and 7-5 in a pair connected to "A" pieces of the column selection circuits 6-2 (where A denotes a natural number of 2 or larger) from the write amplifier 6-10 changes with voltage amplitude almost equal to power source voltage. In the selected one of the "A" pieces of column selection circuits 6-2, the precharge circuit 6-5 is made inactive. After that, the pair of bit lines 6-3 and 6-4 is connected to the common write data lines 7-4 and 7-5 via a data write gate 6-6, and data is written to the cell 6-1 positioned at the intersection between the selected pair of bit lines 6-3 and 6-4 and a row selected by the sub word line 5-5.

In the data reading operation, a cell 6-1 at the intersection between one of the plurality of pairs of bit lines 6-3 and 6-4 selected by the column selection circuit 6-2 and one sub word line selected from the plurality of sub word lines 5-5 is selected, and one of the bit lines 6-3 and 6-4 is discharged, so that a voltage signal having small amplitude is transmitted to the column selection circuit 6-2 via the pair of bit lines 6-3 and 6-4. At this time, in a manner similar to the writing operation, the precharge circuit 6-5 in the selected column selection circuit 6-2 is maintained inactive. The selected pair of bit lines 6-3 and 6-4 is connected to the pair of common read data lines 7-6 and 7-7 to which "B" pieces of column selection circuits (where "B" denotes a natural number of 2 or larger which is different from "A") via the data read gate 6-17 in the selected column selection circuit 6-2 to decrease the potential of one of the common read data lines 7-6 and 7-7, and generate a voltage signal having small amplitude. The voltage signal having small amplitude is transmitted to the pair of common read data lines 7-6 and 7-7. At the time when the potential difference between the common read data lines 7-6 and 7-7 becomes a predetermined potential, the sense amplifier 6-9 is activated by an equalize signal (SAEQ) 7-9, and the potential of corresponding one of sense amplifier output signal lines (SAOUT and /SAOUT) 7-10 and 7-11 is changed with voltage amplitude almost equal to the power source voltage.

A control signal (SACM) 7-8 is a signal for controlling a precharge circuit 6-15 that precharges the pair of common read data lines 7-6 and 7-7 in the sense amplifier 6-9. During the reading operation, the control signal 7-8 functions to always maintain the precharge circuit 6-15 inactive. A plurality of equalize signals 7-9 and a plurality of control signals 7-8 are provided to select only a sense amplifier corresponding to the selected column selection circuit 6-2 among the plurality of sense amplifiers 6-9.

Figure 9:
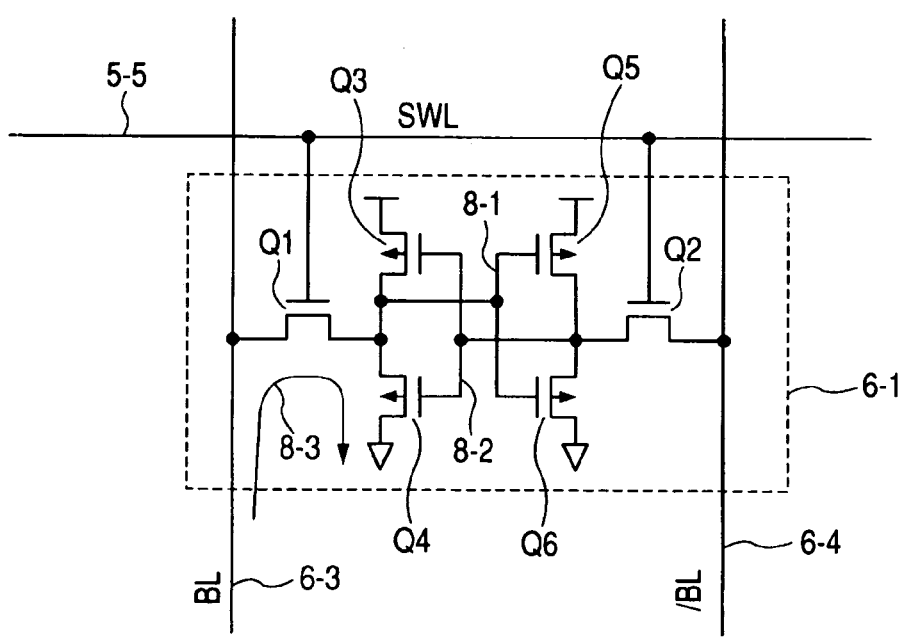
FIG. 9 is a circuit diagram showing a configuration example of the cell.

FIG. 9 shows a configuration example of the cell 6-1.

As shown in FIG. 9, the cell 6-1 is constructed by coupling p-channel type MOS transistors Q3 and Q5 and n-channel type MOS transistors Q1, Q2, Q4, and Q6. By coupling a series-connection circuit of the p-channel type MOS transistor Q3 and the n-channel type MOS transistor Q4 and a series-connection circuit of the p-channel type MOS transistor Q5 and the n-channel type MOS transistor Q6, a storing part is formed. In the storing part, two storage nodes 8-1 and 8-2 are formed. The first storage node 8-1 is coupled to the bit line 6-3 via the n-channel type MOS transistor Q1, and the second storage node 8-2 is coupled to the bit line 6-4 via the n-channel type MOS transistor Q2. The n-channel type MOS transistors Q1 and Q2 are made conductive when the sub word line 5-5 is driven to the high level, thereby coupling the storing part to the pair of bit lines 6-3 and 6-4. In FIG. 9, in the case where low-level data is held in the first storage node 8-1 and high-level data is held in the second storage node 8-2, when the sub word line 5-5 is driven to the high level to make the n-channel type MOS transistors Q1 and Q2 conductive, current flows in the direction indicated by the arrow 8-3 for dissipating read charges.

Figure 7:
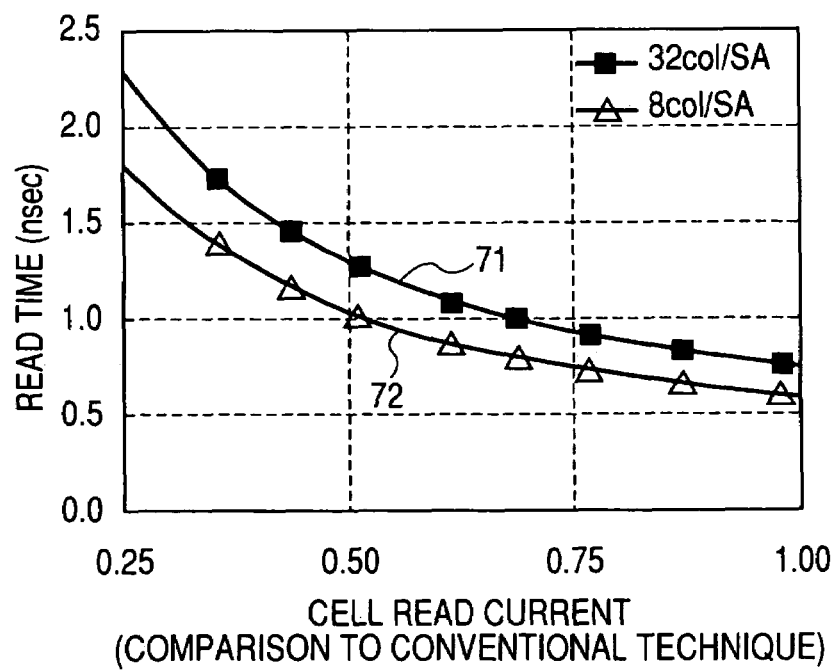
FIG. 7 is a characteristic diagram of a cell in the SRAM.
Figure 8:
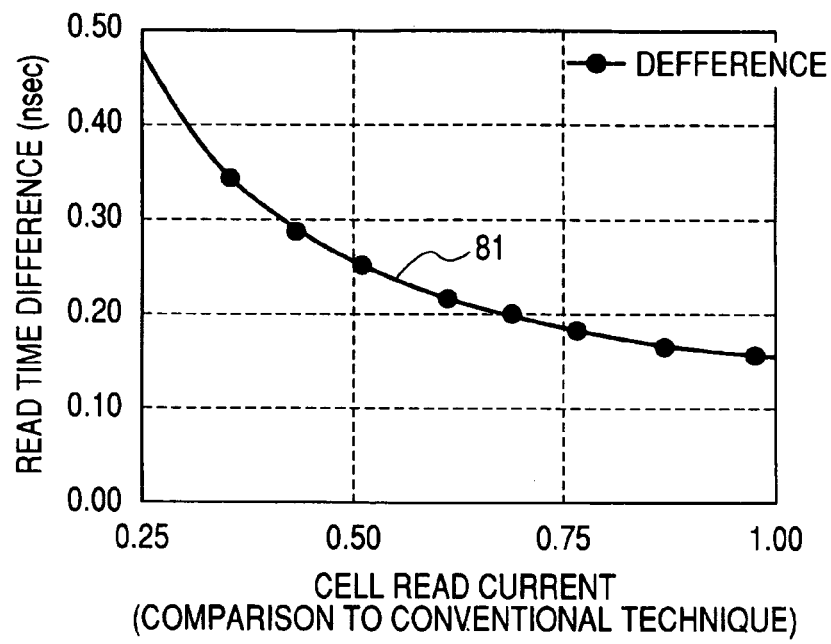
FIG. 8 is a characteristic diagram showing the difference between two characteristic curves in FIG. 7.

FIG. 7 shows the characteristics of the cell. In FIG. 7, the horizontal axis shows cell read current (corresponding to capability of the cell 6-1 to discharge the pair of bit lines 6-3 and 6-4 in the reading operation) and the vertical axis denotes time since the sub word line 5-5 becomes the high level until the potential difference between the pair of common read data lines 7-6 and 7-7 reaches a predetermined value (time required to sufficiently latch the sense amplifier). In the graph, each of two characteristic curves 71 and 72 indicates the number of bit line pairs (col) connected to one sense amplifier (SA), that is, the difference between the numbers of bit line pairs connected one sense amplifier (SA) between the characteristic curves 71 and 72. The characteristic curve 71 shows the characteristic in the case where bit line pairs of 32 col are coupled to one sense amplifier (SA). The characteristic curve 72 shows the characteristic of the case where bit line pairs of 8 col are coupled to one sense amplifier (8 col/SA). As obvious from FIG. 7, read time in the case of the characteristic curve 72 is shorter than that of the characteristic curve 71. It is consequently understood that the smaller the number of bit line pairs connected to one sense amplifier is, the more the read time can be shortened. FIG. 8 shows the difference between the characteristic curves 71 and 72 in FIG. 7. It is understood that the smaller the read current of the cell is, the more reduction in the number of bit line pairs connected to one sense amplifier is effective in increasing the speed of reading.

Figure 10:
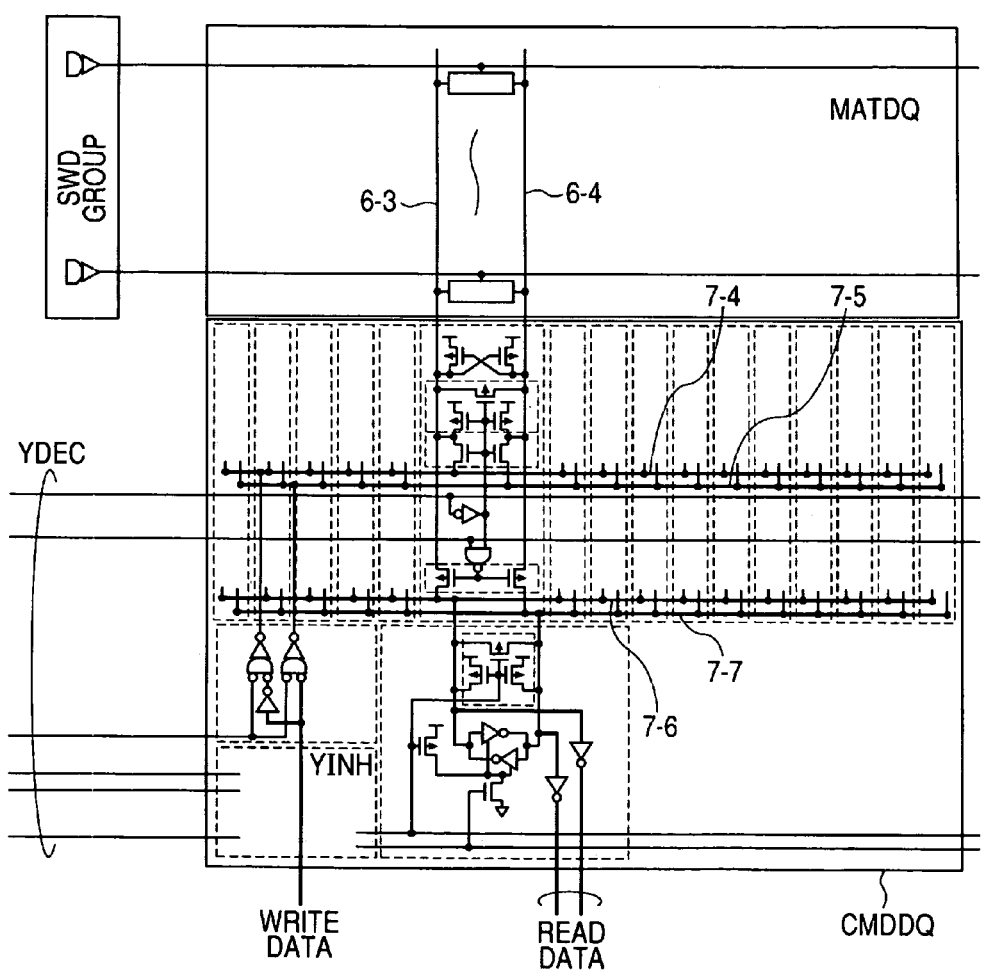
FIG. 10 is a circuit diagram showing a configuration example of a circuit to be compared with the circuit illustrated in FIG. 4.

FIG. 10 shows a configuration to be compared with the configuration shown in FIG. 4.

In the configuration shown in FIG. 10, the number of pairs of bit lines 6-3 and 6-4 connected to one pair of the common write data line pairs 7-4 and 7-5 and the number of bit line pairs 6-3 and 6-4 connected to one pair of common read data lines 7-6 and 7-7 are equal to each other. In such a configuration, to increase the speed of the reading operation on a cell with small read current, it is considered to decrease the number of bit line pairs connected to one pair of common data lines. However, it increases the number of sense amplifiers and the number of write amplifiers and enlarges the layout area of the memory mat.

In contrast, in the configuration shown in FIG. 4, the number of bit line pairs 6-3 and 6-4 connected to one pair of the common write data lines 7-4 and 7-5 and that of bit line pairs 6-3 and 6-4 connected to one pair of the common read data lines 7-6 and 7-7 are different from each other. That is, by increasing the number of bit line pairs connected to one pair of common write data lines 7-4 and 7-5, the number of write amplifiers (WA) 6-10 is decreased. Simultaneously, by decreasing the number of pairs of bit lines 6-3 and 6-4 connected to one pair of common read data lines 7-6 and 7-7, parasitic capacitance caused by elements connected to the common read data line pairs 7-6 and 7-7 is reduced, thereby shortening time of increasing the potential difference between the common read data lines in the pair is shortened.

Figure 11:
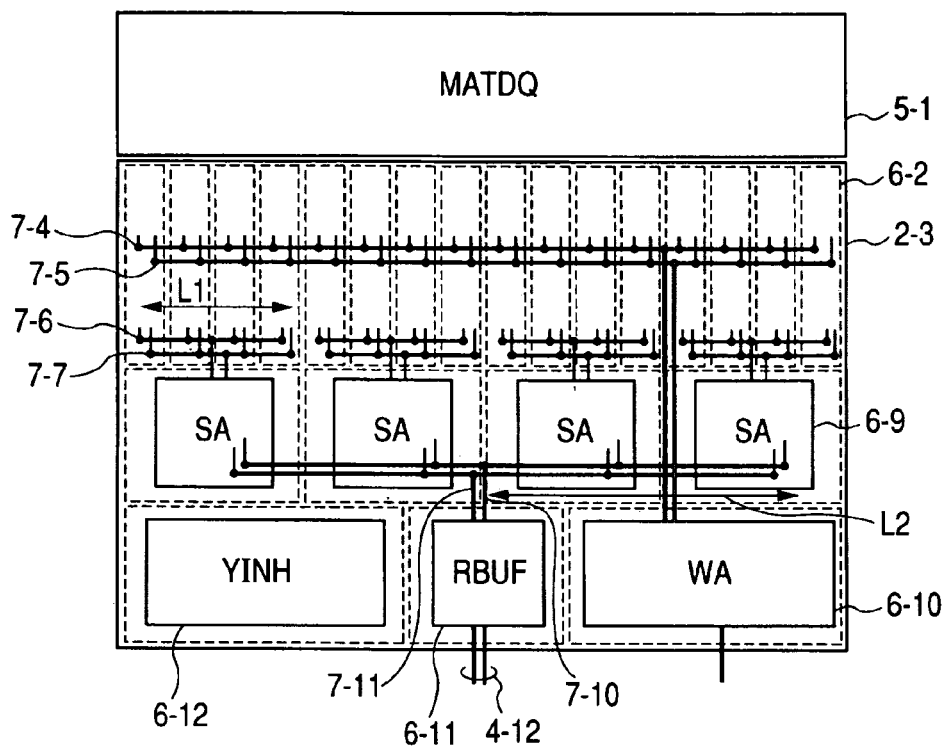
FIG. 11 is a diagram illustrating a chip layout having the configuration shown in FIG. 4.

FIG. 11 shows a layout example in the case of employing the configuration illustrated in FIG. 4.

By increasing the number of bit line pairs connected to the pair of common write data lines 7-4 and 7-5, that is, the number of bit line pairs connected to one write amplifier 6-10, increase in the number of write amplifiers can be avoided, so that enlargement of the layout area can be prevented. Therefore, with the configuration shown in FIG. 4, while preventing enlargement of the chip layout area, read time can be shortened. Moreover, as shown in FIGS. 7 and 8, such effects are more conspicuous as the cell read current is smaller. As shown in FIG. 11, by disposing the plurality of sense amplifiers 6-9 near the plurality of column selection circuits 6-2, the wiring length of the pair of common read data lines 7-6 and 7-7 can be shortened. Consequently, parasitic capacitance of the pair of common read data lines 7-6 and 7-7 can be further reduced. Further, by disposing the buffer circuit (RBUF) 6-11 for connecting read data to a higher-order read data bus almost in the center of a sense amplifier column made of the plurality of sense amplifiers 6-9, wiring length L2 of the pair of sense amplifier output signal lines (SAOUT and /SAOUT) 7-10 and 7-11 can be made the shortest.

By the above-described example, the following effects can be obtained.

(1) In the configuration shown in FIG. 4, the number of pairs of bit lines 6-3 and 6-4 connected to one pair of the common write data lines 7-4 and 7-5 and the number pairs of bit lines 6-3 and 6-4 connected to one pair of the common read data lines 7-6 and 7-7 are different from each other. That is, by increasing the number of bit line pairs connected to one pair of the common write data lines 7-4 and 7-5, the number of write amplifiers (WA) 6-10 is decreased. Simultaneously, by decreasing the number of pairs of bit lines 6-3 and 6-4 connected to one pair of common read data lines 7-6 and 7-7, parasitic capacitance connected to the pair of common read data lines 7-6 and 7-7 is reduced, thereby shortening the time in which the potential difference between the common read data lines in the pair increases. Thus, while preventing enlargement of the chip layout area, the read time can be shortened.

(2) As shown in FIGS. 7 and 8, decrease in the number of bit line pairs connected to one sense amplifier is more effective in increasing the speed of reading, the smaller the cell read current is. Consequently, the effects of (1) are more conspicuous as the cell read current decreases.

(3) By disposing the plurality of sense amplifiers 6-9 near the plurality of column selection circuits 6-2, the wiring length of the pair of common read data lines 7-6 and 7-7 can be shortened and, therefore, parasitic capacitance of the pair of common read data lines 7-6 and 7-7 can be further reduced.

(4) By disposing the buffer circuit (RBUF) 6-11 for connecting read data to a higher-order read data bus in almost center of the sense amplifier column made of a plurality of sense amplifiers 6-9, the wiring length L2 of the pair of sense amplifier output signal lines (SAOUT and /SAOUT) 7-10 and 7-11 can be made shortest.

Next, another configuration example of an SRAM as an example of the semiconductor memory device according to the present invention will be described.

Figure 12:
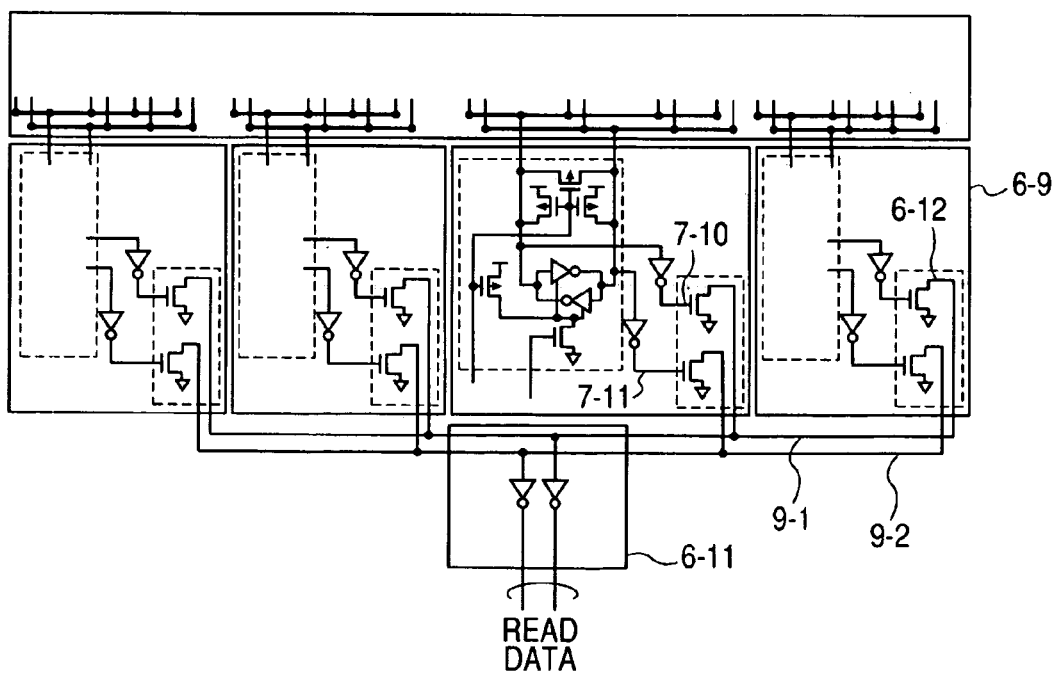
FIG. 12 is a circuit diagram showing another configuration example of a buffer circuit illustrated in FIG. 4 and its periphery.

FIG. 12 shows another configuration example of the buffer circuit (RBUF) 6-11.

As shown in FIG. 12, the n-channel type MOS transistor circuit 6-12 for receiving signals of the pair of sense amplifier output signal lines 7-10 and 7-11 is provided in the sense amplifier 6-9. By commonly connecting the output terminals of the n-channel type MOS transistor circuits 6-12 to the buffer circuit 6-11 via a pair of local data buses 9-1 and 9-2, the number of lines from the sense amplifier 6-9 to the buffer circuit 6-11 can be reduced. Consequently, increase in the lines due to increase in the number of sense amplifiers can be avoided.

Figure 13:
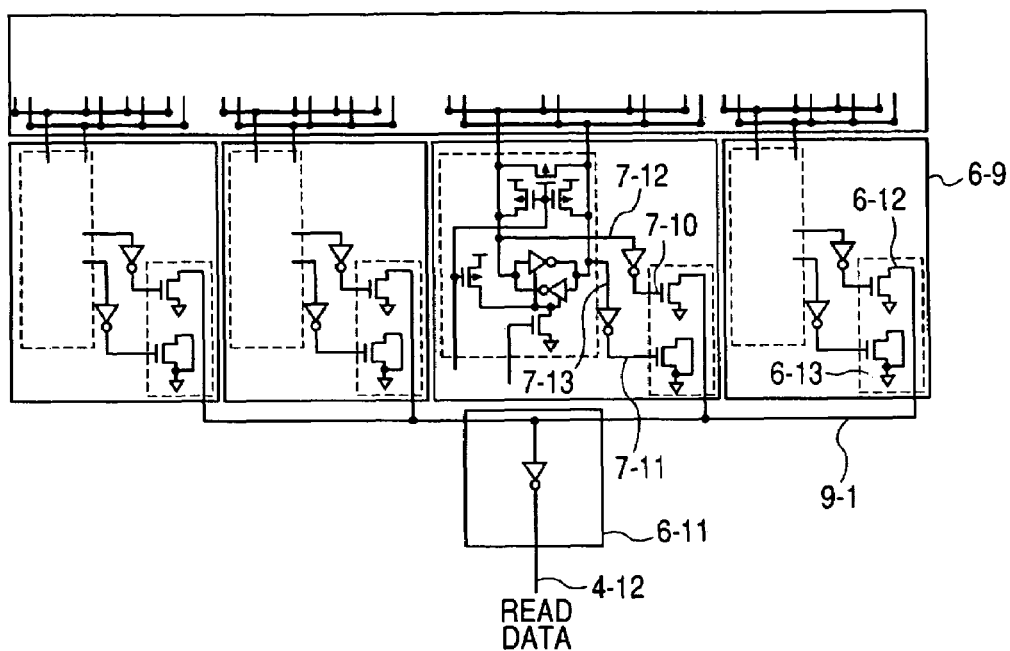
FIG. 13 is a circuit diagram showing another configuration example of the buffer circuit illustrated in FIG. 4 and its periphery.

FIG. 13 shows another configuration example of the buffer circuit (RBUF) 6-11.

As shown in FIG. 13, only a single local data bus as indicated by 9-1 may be used. In this case, the number of local data buses and the layout area of the buffer circuit 6-11 can be reduced. To unify loads of latch nodes 7-12 and 7-13 and output nodes 7-10 and 7-11 in the sense amplifier 6-9, it is desirable to provide an n-channel type MOS transistor 6-13 for receiving a signal of the sense amplifier output signal line (/SAOUT) 7-11 as a dummy element. In such a manner, erroneous operation of the sense amplifiers can be prevented.

Figure 14:
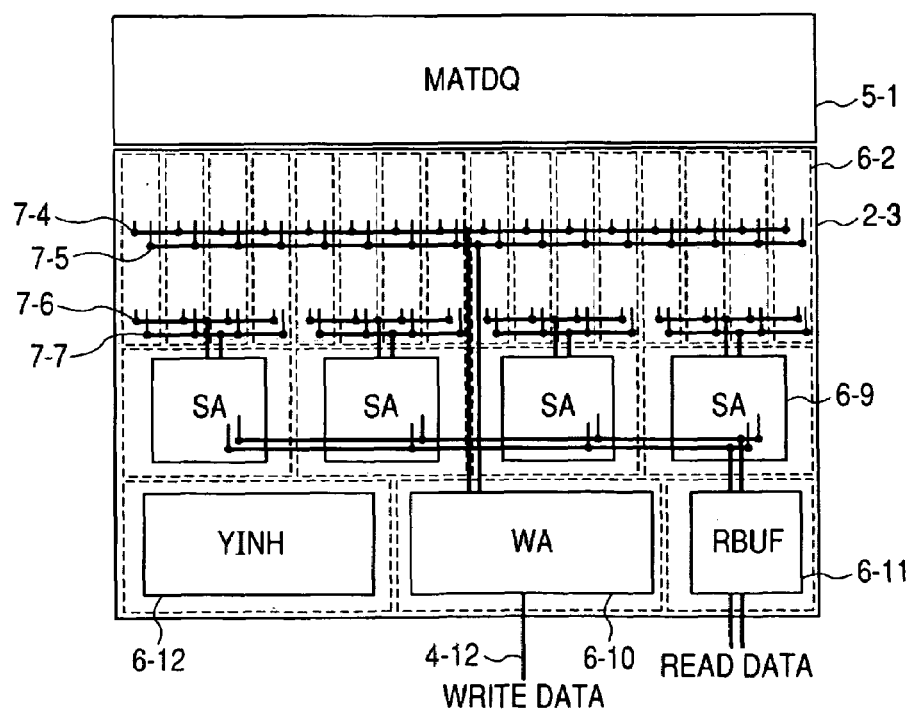
FIG. 14 is a diagram showing another layout of a write amplifier included in the SRAM.

FIG. 14 shows another layout example of the write amplifier (WA) 6-10.

To place priority on shortening of the data write time, the write amplifier 6-10 is provided almost in the center of the sense amplifier column made of the plurality of sense amplifiers 6-9, and the pair of common write data lines 7-4 and 7-5 extends almost the center of the sense amplifier column and is coupled to the write amplifier 6-10. With the configuration, the lines from the write amplifier 6-10 to the pair of common write data lines 7-4 and 7-5 can be shortened, so that parasitic capacitance of the wiring can be reduced and the write time can be shortened.

Figure 15:
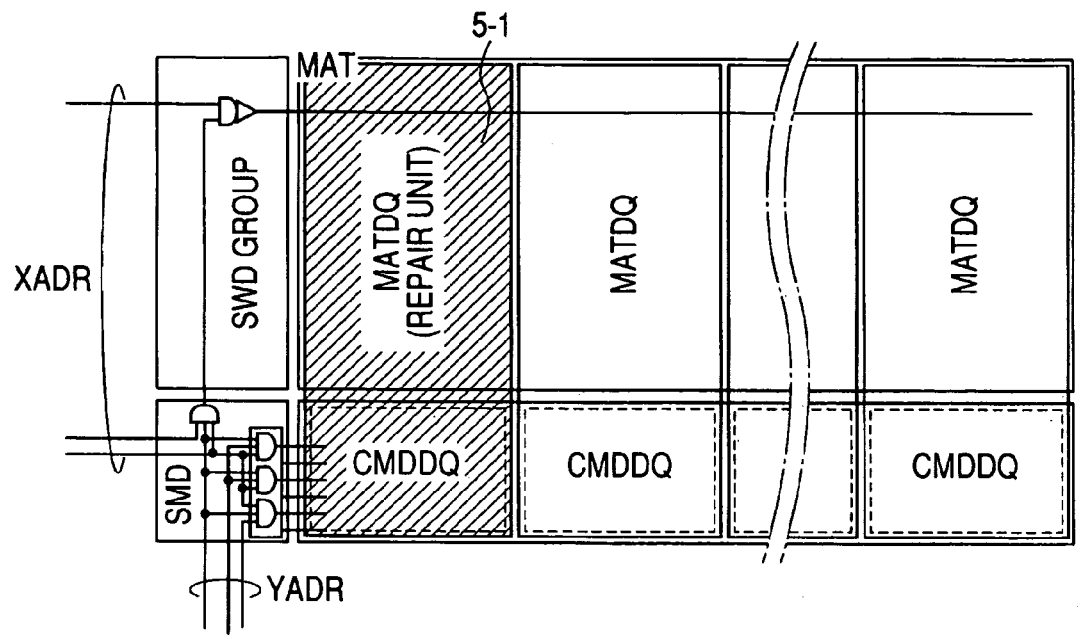
FIG. 15 is a block diagram showing another configuration of the SRAM.
Figure 16:
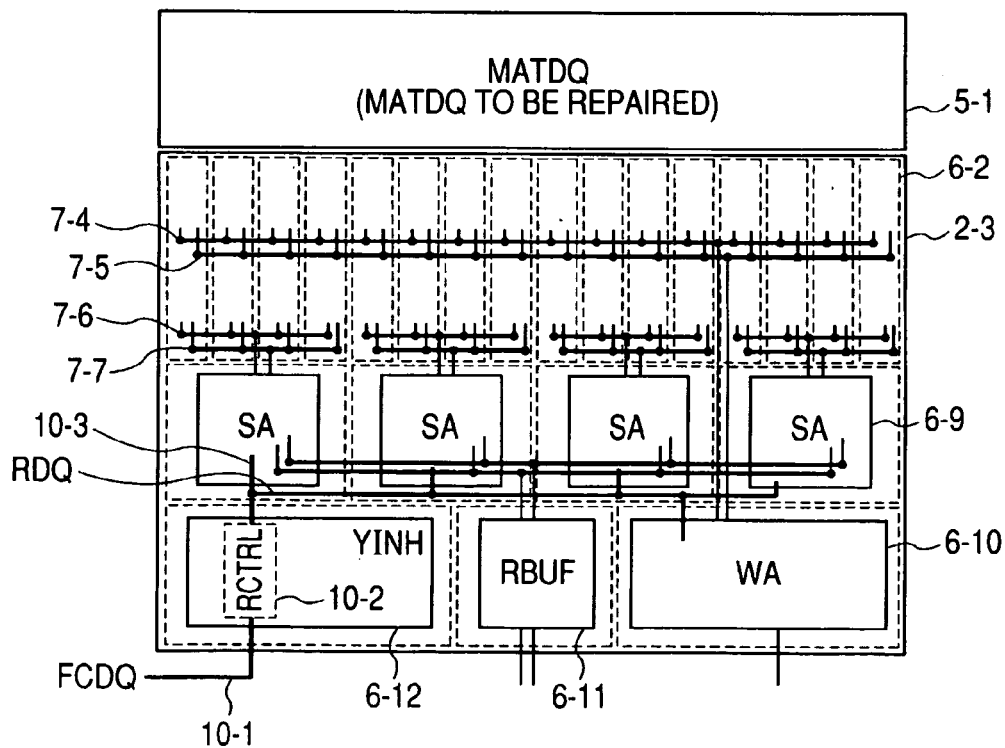
FIG. 16 is a block diagram showing a detailed configuration of a main part in FIG. 15.

FIGS. 15 and 16 show another configuration example of the SRAM 1-1.

With the configuration shown in FIGS. 15 and 16, a defective bit is repaired on the normal sub memory mat (MATDQ) 5-1 unit basis, that is, on the write amplifier unit basis. FIG. 16 schematically shows a repair signal for a normal memory mat. The normal sub memory mat 5-1 in which a defective bit exists is made inactive and, instead, a redundancy sub memory mat is made active. The redundancy sub memory mat is provided in the redundancy memory mat (RMAT) 3-1 shown in FIG. 1. In the case of making the normal sub memory mat 5-1 in which a defective bit exists inactive, an external repair signal (FCDQ) 10-1 is input to the control circuit (YINH) 6-12 that controls the normal sub memory mat 5-1 to be repaired. In response to the signal, in the control circuit 6-12, a control signal (RDQ) 10-3 for inactivating the sense amplifiers 6-9 and the write amplifier 6-10 is supplied from an internal repair control circuit (RCTRL) 10-2 to the sense amplifiers 6-9 and the write amplifier 6-10. By the supply of the control signal 10-3, the sense amplifiers 6-9 and the write amplifier 6-10 are made inactive.

Figure 17:
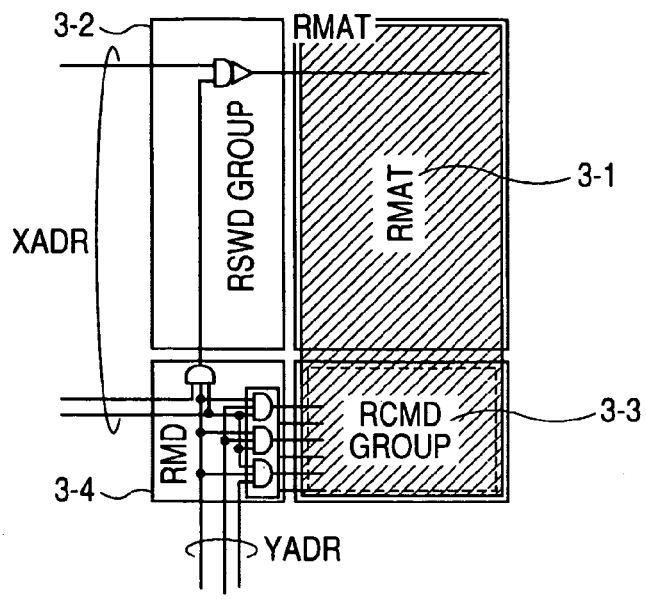
FIG. 17 is a block diagram showing a configuration example of a redundancy memory mat (RMAT) included in the SRAM and its peripheral part.

FIG. 17 shows a configuration example of the redundancy memory mat (RMAT) 3-1 and its peripheral part.

The redundancy memory mat 3-1 and its peripheral part correspond to the normal sub memory mat 5-1 and its peripheral part (refer to FIG. 15). Specifically, the redundancy sub word driver group 3-2, the redundancy column selection circuit group 3-3, and the redundancy sub mat decode circuit 3-4 are provided around the redundancy memory mat 3-1. The redundancy sub word driver group 3-2 includes a plurality of driver circuits for driving redundancy sub word lines. The redundancy sub mat decode circuit 3-4 includes a plurality of logic circuits for decoding an input address signal.

Figure 18:
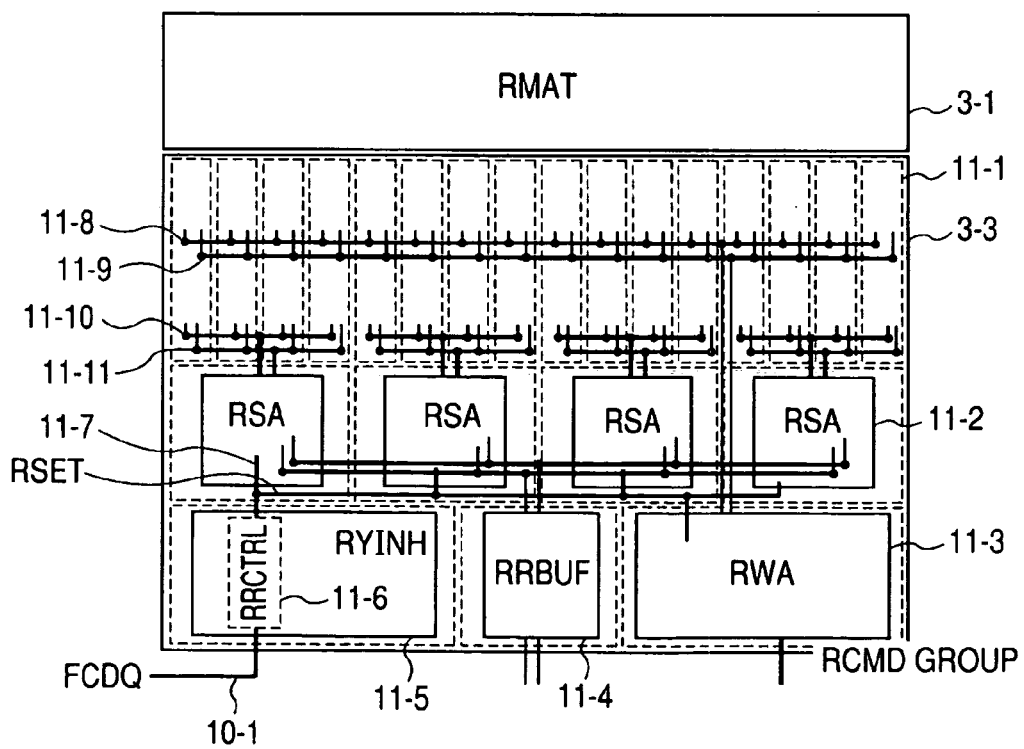
FIG. 18 is a block diagram showing a configuration example of a redundancy column selection circuit group (RCMD group) included in FIG. 17.

FIG. 18 shows a configuration example of the redundancy column selection circuit group (RCMD group) 3-3 in FIG. 17.

Like the normal column selection circuit group, the redundancy column selection circuit group 3-3 includes a plurality of column selection circuits 11-1 for a redundancy memory mat, a plurality of sense amplifiers (RWA) 11-3 for a redundancy memory mat, a buffer (RBUF) 11-4 for a redundancy memory mat, and a control circuit (RYINH) 11-5 for a redundancy memory mat. Different from the case of a normal memory mat, in the redundancy memory mat, when the repair signal (FCDQ) 10-1 is input, a control signal (RSET) 11-7 for activating the circuits for redundancy is supplied to redundancy sense amplifiers (RSA) 11-2 and the redundancy write amplifier (RWA) 11-3.

By setting the normal sub memory mat 5-1 unit, that is, the write amplifier unit as a repair unit (refer to FIGS. 15 and 16), irrespective of increase in the number of sense amplifiers, the number of repair signals does not have to be increased.

Figure 19:
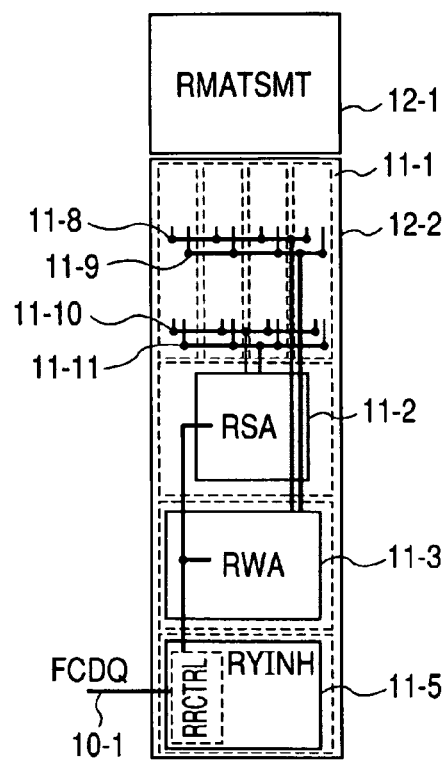
FIG. 19 is a block diagram showing a configuration example of a main part in the case of performing another redundancy repair in the SRAM.

FIG. 19 shows a configuration example in the case of employing another redundancy repairing method.

A redundancy memory mat shown in FIG. 19 includes a redundancy sub memory mat (RMASMT) 12-1 and a redundancy column selection circuit (RCMDSMT) 12-2 corresponding to the redundancy sub memory mat 12-1. In such a redundancy memory mat, different from a normal memory mat, the sense amplifiers 11-2 and the write amplifiers 11-3 of the same number are provided. To the pair of common write data lines 11-8 and 11-9 and the pair of common read data lines 11-10 and 11-11, bit line pairs of the same number are provided. A redundancy memory mat is activated by the external repair signal (FCDQ) 10-1 in a manner similar to the case shown in FIG. 16.

Figure 20:
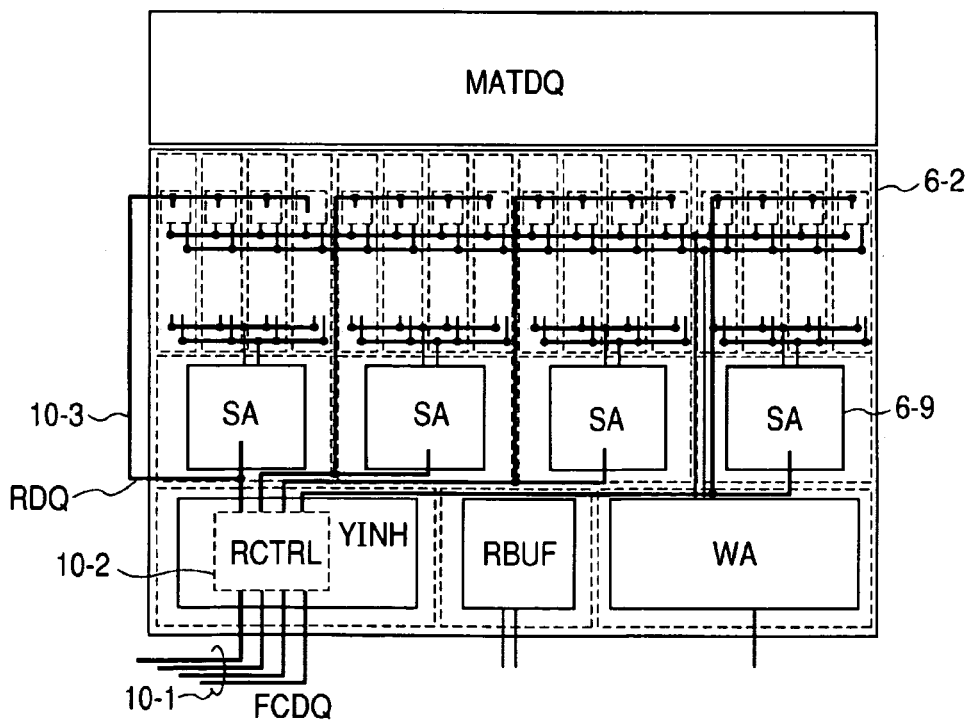
FIG. 20 is a block diagram showing a configuration example of a normal memory mat corresponding to the repairing method illustrated in FIG. 19.

FIG. 20 shows the outline of a repair signal distributing method in a normal memory mat corresponding to the repairing method illustrated in FIG. 19.

The repair signals (FCDQ) 10-1 are provided in correspondence with the number of the sense amplifiers, and the repair signals (RDQ) 10-3 are distributed from the repair control circuit (RCTRL) 10-2 to the sense amplifiers 6-9 and the column selection circuit 6-2. By inputting the repair signal 10-3 to the write selection gate in the column selection circuit 6-2 and inactivating the write selection gate at the time of repair, the column selection circuit 6-2 corresponding to a bit to be repaired can be made inactive on the sense amplifier unit basis.

Figure 21:
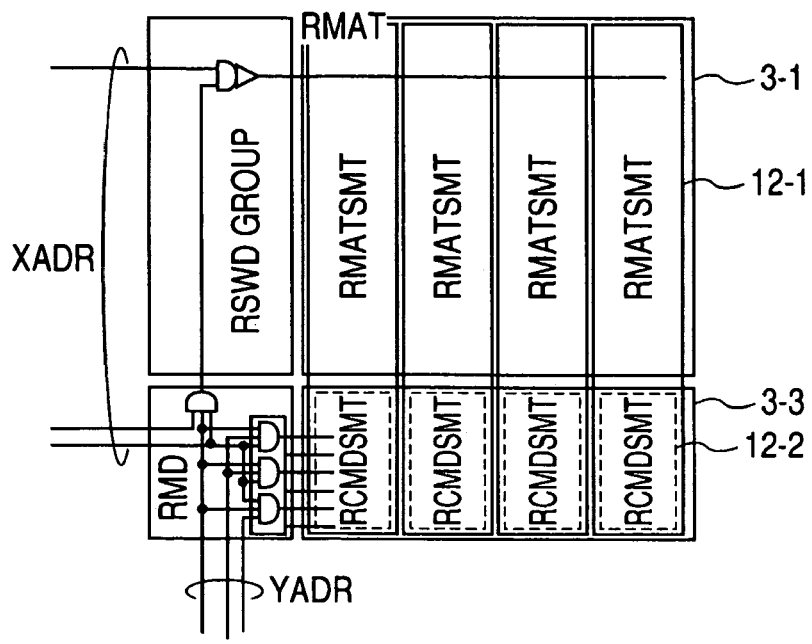
FIG. 21 is a block diagram showing a configuration example of a redundancy memory mat in the case of employing the repairing method illustrated in FIG. 19.

FIG. 21 shows a layout example of the redundancy memory mat.

As shown in FIG. 21, for one redundancy memory mat 3-1, four redundancy sub memory mats (RMATSMT) 12-1 and four redundancy column selection circuits (RCMDSMT) 12-2 corresponding to the redundancy sub memory mats 12-1 are provided. Therefore, in the case of employing the configuration shown in FIG. 19, by performing redundancy repair on the sense amplifier unit basis, the number of repair units is four times as many as that in the case of performing repair on the normal sub memory mat 5-1 unit basis (write amplifier unit basis). In such a manner, repairing efficiency can be improved.

Figure 22:
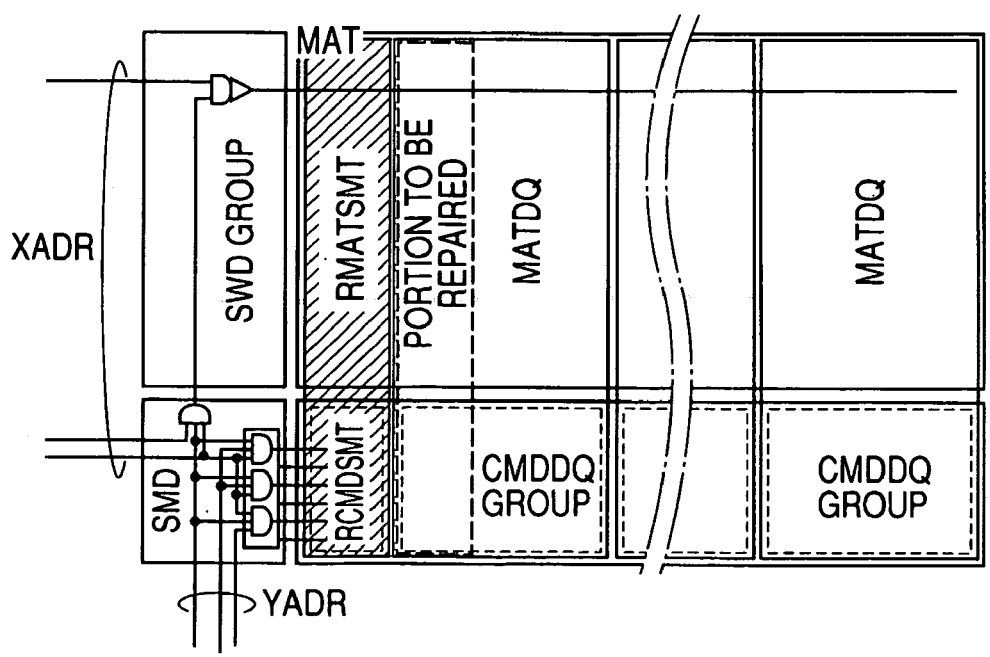
FIG. 22 is a block diagram showing a configuration example of a main part in the case of performing another redundancy repair in the SRAM.

FIG. 22 shows a configuration example in the case of employing another redundancy repairing method.

In the case of performing repair on the sense amplifier unit basis, as compared with the case of performing repairing on the memory mat unit basis, the layout area of the redundancy memory mat as a repair unit is reduced. Consequently, as shown in FIG. 22, a redundancy memory mat may be provided in a normal memory mat. With such a configuration, as compared with the case where a normal memory mat and a redundancy memory mat are formed in different areas, a method of distributing an address signal connected to a redundancy memory mat, designing of timings of a redundancy data bus, and the like can be facilitated.

Although the present invention achieved by the inventors herein has been described concretely, obviously, the invention is not limited to the foregoing embodiments but can be variously modified without departing from the gist.

Although an SRAM as the field of utilization which is the background of the present invention achieved by the inventors herein has been described above, the invention is not limited to the SRAM but can be applied to various semiconductor memory devices.

The present invention can be applied under condition that a write amplifier and a sense amplifier are shared by bit lines.

What is claimed is:

1. A semiconductor memory device comprising:
   a plurality of word lines;
   a plurality of bit lines provided so as to cross the word lines;
   a plurality of memory cells coupled to the word lines and the bit lines;
   a write amplifier for writing data to the memory cells; and
   a sense amplifier for amplifying a signal output from the memory cells,
   the write amplifier and the sense amplifier being shared by the bit lines,
   wherein a first common data line for connecting the bit lines to the write amplifier, and a second common data line for connecting the bit lines to the sense amplifier are included, and
   wherein the number of bit lines corresponding to the second common data line is smaller than the number of bit lines corresponding to the first common data lines.

2. The semiconductor memory device according to claim 1, wherein the memory cell is a static memory cell.

3. The semiconductor memory device according to claim 2, wherein when a sense amplifier column is formed by arranging a plurality of sense amplifiers and a buffer for outputting output signals of the sense amplifiers to the outside is shared by the plurality of sense amplifiers, the buffer is disposed almost in the center of the column of the plurality of sense amplifiers.

4. The semiconductor memory device according to claim 3, further comprising a control circuit capable of controlling operations of the sense amplifiers, the write amplifier, and the buffer,
   wherein the control circuit and the write amplifier are arranged so as to sandwich the buffer.

5. The semiconductor memory device according to claim 2, wherein a sense amplifier column is formed by arranging a plurality of sense amplifiers and a buffer for outputting output signals of the sense amplifiers to the outside is shared by the plurality of sense amplifiers, the write amplifier is provided almost in the center of the sense amplifier column, and the first common data line extends in an almost center part of the sense amplifier column and is coupled to the write amplifier.

6. The semiconductor memory device according to claim 5, further comprising a control circuit capable of controlling operations of the sense amplifiers, the write amplifier, and the buffer,
   wherein the control circuit and the buffer are arranged so as to sandwich the write amplifier.

7. The semiconductor memory device according to claim 4, wherein the buffer includes a logic circuit for obtaining OR logic of signals output from the plurality of sense amplifiers via the second common data line.

8. The semiconductor memory device according to claim 4, wherein the sense amplifiers amplify input signals of complementary levels and includes an output part for outputting only one of the signals of complementary levels.

9. The semiconductor memory device according to claim 7, further comprising a redundancy circuit for repairing a defect,
   wherein the redundancy circuit comprises:
   a plurality of redundancy word lines;
   a plurality of redundancy bit lines provided so as to cross the redundancy word lines;
   a plurality of redundancy memory cells coupled to the redundancy word lines and the redundancy bit lines;
   a redundancy write amplifier for writing data to the redundancy memory cells;
   a redundancy sense amplifier for amplifying a signal output from the redundancy memory cells;
   a first redundancy common data line for connecting the redundancy bit line and the redundancy write amplifier; and
   a second redundancy common data line for connecting the redundancy bit line and the redundancy sense amplifier, and
   wherein the number of redundancy bit lines corresponding to the first redundancy common data line and the number of redundancy bit lines corresponding to the second redundancy common data line are equal to each other.

10. A semiconductor memory device comprising:
    a plurality of word lines;
    a plurality of bit lines provided so as to cross the word lines;
    a plurality of memory cells coupled to the word lines and the bit lines;
    a write amplifier for writing data to the memory cells; and
    a sense amplifier for amplifying a signal output from the memory cells,
    wherein the write amplifier and the sense amplifier are shared by the bit lines, and the number of bit lines corresponding to the sense amplifier is smaller than the number of bit lines corresponding to the write amplifier.

* * * * *